Dec. 8, 1970 HIROMU OUCHI ET AL 3,546,121

PIEZOELECTRIC CERAMIC COMPOSITIONS

Filed July 25, 1968 2 Sheets-Sheet 1

INVENTORS
HIROMU OUCHI
MASAMITSU NISHIDA
By Wenderoth, Lind & Ponack, Attorneys

INVENTORS
HIROMU OUCHI
MASAMITSU NISHIDA
By Wenderoth, Lind & Ponack, Attorneys

United States Patent Office 3,546,121
Patented Dec. 8, 1970

3,546,121

PIEZOELECTRIC CERAMIC COMPOSITIONS

Hiromu Ouchi, Toyonaka-shi, and Masamitsu Nishida, Osaka-shi, Japan, assignors to Matsushita Electric Industrial Co., Ltd., Osaka, Japan Filed July 25, 1968, Ser. No. 747,547
Int. Cl. C04b 35/46, 35/48
U.S. Cl. 252—62.9 8 Claims

ABSTRACT OF THE DISCLOSURE

Piezoelectric ceramic compositions which comprise the ternary system $$Pb(Mg_{1/3}Ta_{2/3})O_3\text{-}PbTiO_3\text{-}PbZrO_3$$

and which contain, as additives, up to 5% by weight of $MnO_2$ and NiO, are particularly useful in the manufacture of electromechanical transducers.

This invention relates to piezoelectric ceramic compositions and articles of manufacture fabricated therefrom. More particularly, the invention pertains to novel ferroelectric ceramics which are polycrystalline aggregates of certain constituents. These piezoelectric compositions are sintered to ceramics by per se conventional ceramic techniques and thereafter the sintered ceramics are polarized by applying a D-C (direct current) voltage between the electrodes to impart thereto electromechanical transducing properties similar to the well known piezoelectric effect. The invention also encompasses the calcined product of raw ingredients and articles of manufacture such as electro-mechanical transducers fabricated from the sintered ceramic, The ceramic bodies materialized by the present invention exist basically in the following solid solution comprising (1) the binary system $Pb(Mg_{1/3}Ta_{2/3})O_3$-$PbTiO_3$ or (2) the ternary system $Pb(Mg_{1/3}Ta_{2/3})O_3$-$PbTiO_3$-PbZrO modified with combined $MnO_2$ and NiO additives up to 5 weight percent, respectively.

The use of piezoelectric materials in various transducer applications in the production, measurement and sensing of sound, shock, vibration, pressure, etc. has increased greatly in recent years. Both crystal and ceramic types of transducers have been widely used. But, because of their potentially lower cost and facility in the fabrication of ceramics with various shapes and sizes and their greater durability for high temperature and/or for humidity than that of crystalline substances such as Rochelle salt, piezoelectric ceramics materials have recently achieved importance in various transducer applications.

The piezoelectric characteristics required of ceramics vary with different applications. For example, electromechanical transducers such as phonograph pick-ups and microphones require piezoelectric ceramics characterized by a substantially high electromechanical coupling coefficient and dielectric constant. On the other hand, in filter applications of piezoelectric ceramics, it is desired that the material exhibit a higher value of mechanical quality factor and high electromechanical coupling coefficient. Furthermore, ceramic materials require a high stability with temperature and time in resonant frequency and in other electrical properties.

As more promising ceramic for these requirements, lead titanate-lead zirconate is in wide use up to now. However, it is difficult to get a very high mechanical quality factor combined with high planar coupling coefficient in the lead titanate-lead zirconate ceramics.

It is, therefore, the fundamental object of the present invention to provide novel and improved piezoelectric ceramic materials which overcome at least one of the problems outlined above.

A more specific object of the invention is to provide improved polycrystalline ceramics characterized by very high mechanical quality factor combined with high piezoelectric coupling coefficient.

Another object of the invention is the provision of novel piezoelectric ceramic compositions, certain properties of which can be adjusted to suit various applications.

A further object of the invention is the provision of improved electromechanical transducers utilizing, as the active elements, an electrostatically polarized body of the novel ceramic compositions.

These objects of the invention and the manner of their attainment will be readily apparent from a reading of the following description and from the accompanying drawing, in which.

Figure 1:
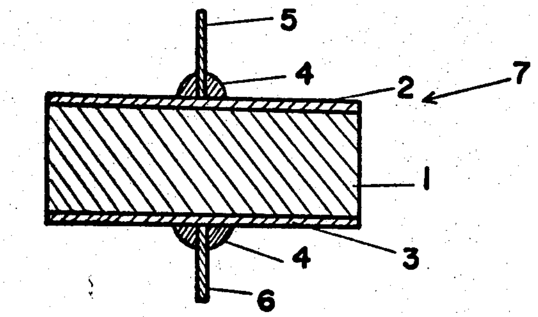
FIG. 1 is a cross-sectional view of an electromechanical transducer embodying the present invention.

Before proceeding with a detailed description of the piezoelectric materials contemplated by the invention, their application in electromechanical transducers will be described with reference to FIG. 1 of the drawings wherein reference character 7 designates, as a whole, an electromechanical transducer having, as its active element, a preferably disc-shaped body 1 of piezoelectric ceramic material according to the present invention.

Body 1 is electrostatically polarized, in a manner hereinafter set forth, and is provided with a pair of electrodes 2 and 3, applied in a suitable and per se conventional manner, on two opposed surfaces thereof. Wire leads 5 and 6 are attached conductively to the electrodes 2 and 3 respectively by means of solder 4. When the ceramic is subjected to shock, vibration or other mechanical stress, the generated electrical output can be taken from wire leads 5 and 6. Conversely, as with other piezoelectric transducers, application of electrical voltage to electrodes 2 and 3 will result in mechanical deformation of the ceramic body. It is to be understood that the term electromechanical transducer as used herein is taken in is taken in its broadest sense and includes piezoelectric filters, frequency control devices, and the like, and that the invention may also be used and adapted to various other applications requiring materials having dielectric, piezoelectric and/or electrostrictive properties.

According to the present invention, the ceramic body 1, FIG. 1, is formed of novel piezoelectric compositions which are polycrystalline ceramics composed of $$Pb(Mg_{1/3}Ta_{2/3})O_3\text{-}PbTiO_3$$

or $Pb(M_{1/3}Ta_{2/3})O_3$-$PbTiO_3$-$PbZrO_3$ modified with combined $MnO_2$ and $N_iO$ additives.

It was found that a solid solution in a perovskite-type structure was formed from a mixture of the binary $Pb(Mg_{1/3}Ta_{2/3})O_3$ and $PbTiO_3$ in all proportions. The solid solution has a morphotropic phase boundary at a composition: 59.0 mole percent of $Pb(Mg_{1/3}Ta_{2/3})O_3$ and 41.0 mole percent of $PbTiO_3$. A planar piezoelectric coupling coefficient is the highest in the vicinity of morphotropic composition and becomes lower as the composition departs from the morphotropic composition. Further, the ternary system $Pb(Mg_{1/3}Ta_{2/3})O_3$, $PbTiO_3$ and $PbZrO_3$ also exists in a solid solution in all compositions. The piezoelectric property is much more improved in the ternary system than in the above binary system, and is excellent in the vicinity of morphotropic composition. The solid solution of the ternary system exists in a perovskite-type structure of $Pb(Mg_{1/3}Ta_{2/3})O_3$ which is modified by partially replacing sites of $(Mg_{1/3}Ta_{2/3})$ with Ti and/or Zr. The present invention is based on the discovery that within particular ranges of the base ternary system, the specimens modified with combined $MnO_2$ and NiO additives exhibit a very high mechanical quality factor combined with high planar coupling coefficient.

The present invention has various advantages in the manufacturing process and in application for ceramic transducers. It has been known that the evaporation of PbO during firing is a problem in sintering of lead compounds such as lead titanate zirconate. The invented composition, however, shows a smaller amount of evaporated PbO than usual lead titanate zirconate does. The ternary system can be fired without any particular control of PbO atmosphere. A well sintered body of present composition is obtained by firing in a ceramic crucible with a ceramic cover made of $Al_2O_3$ ceramics. A high sintered density is desirable for humidity resistance and high piezoelectric response when the sintered body is applied to a resonator and others.

Figure 2:
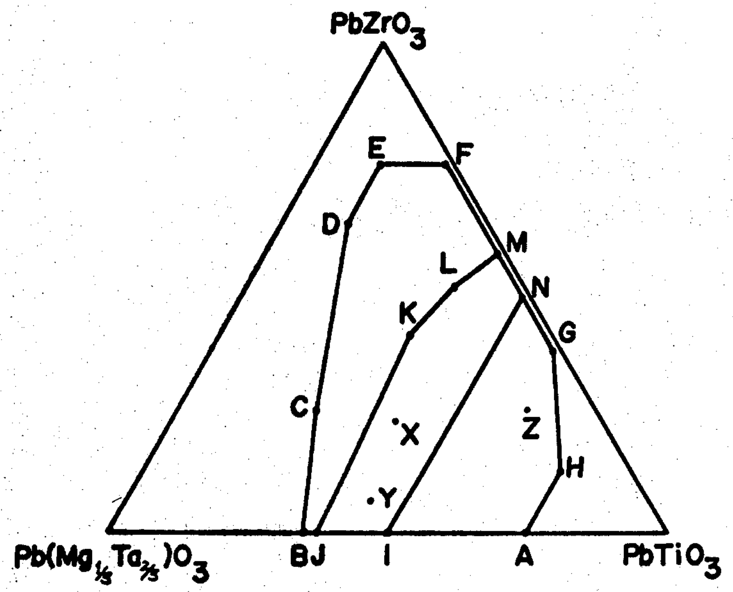
FIG. 2 is a triangular compositional diagram of materials utilized in the present invention.

All possible compositions coming within the binary system $Pb(Ma_{1/3}Ta_{2/3})O$-$PbTiO_3$ or the ternary system $Pb(Mg_{1/3}Ta_{2/3})O_3$-$PbTiO_3$-$PbZrO_3$ are represented by the triangular diagram constituting FIG. 2 of the drawings. Some compositions represented by the diagram, however, do not exhibit high piezoelectricity, and many are electromechanically active only to a slight degree. The present invention is concerned only with those compositions exhibiting piezoelectric response of appreciable magnitude. As a matter of convenience, the planar coupling coefficient ($K_p$) of test discs will be taken as a measure of piezoelectric activity. Thus, within the area bounded by lines connecting points ABCDEFGH, FIG. 2, all compositions polarized and tested showed a planar coupling coefficient of approximately 0.2 or higher. Particularly, the compositions in the area of the diagram bounded by lines connecting points IJKLMN, FIG. 2, exhibit a planar coupling coefficient of approximately 0.3 or higher, the molar percent of the three components of compositions ABCEDFGHIJKLMN being as follows:

| | $Pb(Mg_{1/3}Ta_{2/3})O_3$ | $PbTiO_3$ | $PbZrO_3$ |
|---|---|---|---|
| A | 25.0 | 75.0 | 0.0 |
| B | 65.5 | 34.5 | 0.0 |
| C | 50.0 | 25.0 | 25.0 |
| D | 25.0 | 12.5 | 62.5 |
| E | 12.5 | 12.5 | 75.0 |
| F | 1.0 | 24.0 | 75.0 |
| G | 1.0 | 61.5 | 37.5 |
| H | 12.5 | 75.0 | 12.5 |
| I | 50.0 | 50.0 | 0 |
| J | 62.5 | 37.5 | 0 |
| K | 25.0 | 34.5 | 40.5 |
| L | 12.5 | 37.5 | 50.0 |
| M | 1.0 | 42.0 | 57.0 |
| N | 1.0 | 51.0 | 48.0 |

Furthermore, the compositions near the morphotropic phase boundary, particularly $$Pb(Mg_{1/3}Ta_{2/3})_{0.25}\ TiO_{0.4}ZrO_{0.35}O_3$$

$$Pb(Mg_{1/3}Ta_{2/3})_{0.250}Ti_{0.4}Zr_{0.225}O_3$$

and $$Pb(Mg_{1/3}Ta_{2/3})_{0.125}Ti_{0.435}Zr_{0.44}O_3$$

give ceramic products having a planar coupling coefficient of 0.55 or higher.

According to the present invention it has been discovered than an addition of combined additives of nickel oxide and manganese oxide improves the $Q_M$ and $K_p$ of the binary or ternary solid solution defined by the polygonal area ABCDEF in FIG. 2 more extensively than a single addition of nickel oxide or manganese oxide. Operable additive combination comprises 0.1 to 5 weight percent of nickel oxide (NiO) and 0.1 to 5 weight percent of manganese oxide ($MnO_2$).

It is necessary for obtaining high $Q_M$ and high $K_p$ that said additive combination be in a weight ratio of 0.2 to 10 of nickel oxide to manganese oxide. Operable weight percent of said combination is not more than 6%. An addition of said combination of more than 7 weight percent reduces slightly the $K_p$ and clearly the $Q_M$ of the ternary solid solution. A more desirable improvement in the $K_p$ and $Q_M$ of ternary solid solution defined by and included within the polygonal area IJKLMN in FIG. 2 can be obtained by employing 0.5 to 1 weight percent of additive combination having 0.5 to 2.0 of the weight ratio of NiO to $MnO_2$. Desirable effects of more specified additions will be readily understood by the specified examples indicated in the following table.

The composition described herein may be prepared in accordance with various per se well known ceramic procedures. A preferred method, however, hereinafter more fully described, consists in the use of PbO or $Pb_3O_4$, MgO or $MgCO_3$, $ZrO_2$, $TiO_2$, $MnO_2$ and NiO.

The starting materials, viz., lead oxide (PbO), magnesium (MgO), tantalum pentoxide ($Ta_2O_5$), titania ($TiO_2$), zirconia ($ZrO_2$), $MnO_2$ and NiO, all of relatively pure grade (e.g., C.P. grade) are intimately mixed in a rubber-lined ball mill with distilled water. In milling the mixture, care should be exercised to avoid, or the proportions of ingredients varied to compensate for, contamination by wear of the milling ball or stones.

Following the wet milling, the mixture is dried and mixed to assure as homogeneous a mixture as possible. Thereafter, the mixture is suitably formed into desired forms at a pressure of 400 kilograms per square centimeter. The compacts are pre-reacted by calcination at a temperature of around 850° C. for 2 hours.

After calcination, the reacted material is allowed to cool and is then wet milled to a small particle size. Once again, care should be exercised to avoid, or the proportions of ingredients varied to compensate for, contamination by wear of the milling balls or stones. Depending on preference and the shapes desired, the material may be formed into a mix or slip suitable for pressing, slip casting or extruding, as the case may be, in accordance with per se conventional ceramic procedures.

The samples for which data are given hereinbelow were prepared by mixing 100 grams of the milled pre-sintered mixture with 5 cc. of distilled water. The mix was then pressed into discs of 20 mm. diameter and 2 mm. thickness at a pressure of 700 kg./cm.$^2$. The pressed discs are fired at a temperature set forth in the table for a heating period of 45 minutes. According to the present invention, there is no need to fire the composition in an atmosphere of PbO and no special care is required for the temperature gradient in a furnace compared with the prior art. Thus, according to the present invention, uniform and excellent piezoelectric ceramic products can be easily obtained simply by covering the samples in an alumina crucible with an alumina ceramic cover.

The sintered ceramics are polished on both surfaces to the thickness of one millimeter. The polished disc surfaces may then be coated with silver paint and fired to form silver electrodes. Finally, the discs are polarized while immersed in a bath of silicone oil at 100° C. A voltage gradient of D-C 4 kv. per mm. is maintained for one hour, and the discs are field-cooled to room temperature in thirty minutes.

Figure 3:
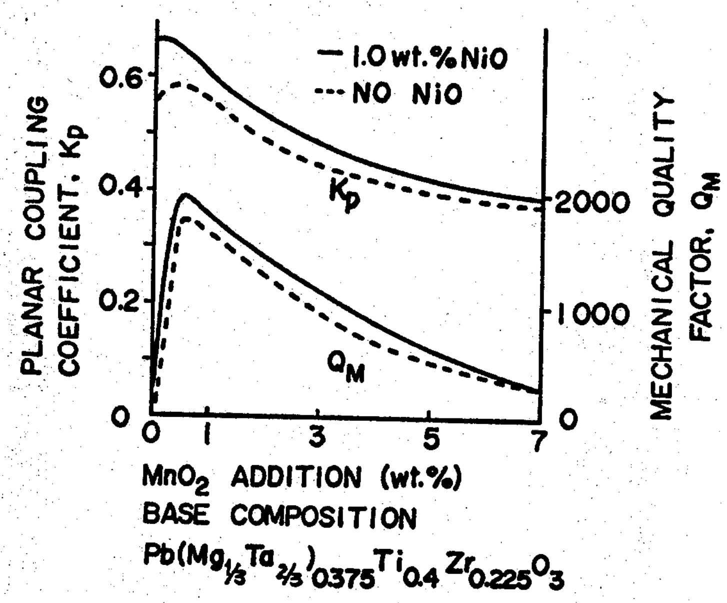
FIGS. 3 and 4 are graphs showing the effect of amounts of additives on the mechanical quality factor ($Q_M$), and the planar coupling coefficient ($K_p$) of exemplary compositions according to the present invention at 20° C. and 1 kc.

The piezoelectric and dielectric properties of the polarized specimen have been measured at 20° C. in a relative humidity of 50% and at a frequency of 1 kc. A measurement of piezoelectric properties was made by the IRE standard circuit and the planar coupling coefficient was determined by the resonant to anti-resonant frequency method. Examples of specific ceramic compositions according to this invention and various pertinent electromechanical and dielectric properties thereof are given in the table infra and some of their values are plotted in FIGS. 3 and 4 to show the variation with additives. Compositions without additives and with only one additive are also given in the table and in FIGS. 3 and 4 for purpose of comparison. From the table it will be readily evident that all exemplary compositions modified with an addition of both 0.1 to 5 weight percent of nickel oxide and 0.1 to 5 weight percent of manganese oxide are characterized by very high mechanical quality factor, high planar coupling, relatively high dielectric constant and low dissipation factor, all of which properties are important to the use of piezoelectric compositions in filter applications. Example Nos. 1 to 29, Example Nos. 30 to 35 and Example Nos. 36 to 40 listed in the table correspond to a composition defined by X, Y and Z in FIG. 2, respectively. FIG. 3 indicates the effect of amounts of $MnO_2$ addition on the mechanical quality factor ($Q_M$) and the planar coupling coefficient ($K_p$) of exemplary base compositions having 0.1 weight percent of NiO addition. From this figure it will be seen that the compositions modified with combined NiO and $MnO_2$ additives exhibit a noticeable improvement of mechanical quality factor plications by appropriately selecting the base composition and amounts of combined additives. With a ceramic combined additives. With a ceramic composition containing combined additives in an amount more than 7 weight percent respectively, improvement of the mechanical quality factor is hardly noticeable and the planar coupling coefficient is low. For this reason they are excluded from the scope of the present invention.

In addition to the superior properties shown hereinbelow, compositions according to the present invention yield ceramics of good physical quality and which polarize well. It will be understood from the foregoing that the ternary solid solution $Pb(Mg_{1/3}Ta_{2/3})Q_3$-$PbTiO_3$-$PbZro_3$ modified with combined $MnO_2$ and NiO additives form an excellent piezoelectric ceramic body.

While there have been described what at present are believed to be the preferred embodiments of this invention, various changes and modifications can be made therein without departing from the invention, and it is aimed, therefore, to cover in the appended claims all such changes and modifications as fall within the true spirit and scope of the invention.

| | Intended composition | | | | 24 hours after poling | | | |
|---|---|---|---|---|---|---|---|---|
| | | Additives in weight percent | | | | | | |
| Example No. | Base composition | $MnO_2$ | NiO | Firing temp., °C. | Mechanical quality factor, $Q_K$ | Planar coupling coeffi., Kp | Dielectric constant at 1 Kc., P.S. | Dissipation D in percent at 1 kc., P.S. |
| 1 | $Pb(Mg_{1/3}Ta_{2/3})_{0.375}Ti_{0.4}Zr_{0.225}O_3$ | None | None | 1,270 | 90 | 0.55 | 1,826 | 1.81 |
| 2 | $Pb(Mg_{1/3}Ta_{2/3})_{0.375}Ti_{0.4}Zr_{0.225}O_3$ | | 1.0 | 1,240 | 96 | 0.64 | 2,152 | 1.10 |
| 3 | $Pb(Mg_{1/3}Ta_{2/3})_{0.375}Ti_{0.4}Zr_{0.225}O_3$ | 0.1 | | 1,260 | 398 | 0.57 | 1,724 | 0.89 |
| 4 | $Pb(Mg_{1/3}Ta_{2/3})_{0.375}Ti_{0.4}Zr_{0.225}O_3$ | 0.1 | 1.0 | 1,260 | 890 | 0.67 | 1,934 | 0.83 |
| 5 | $Pb(Mg_{1/3}Ta_{2/3})_{0.375}Ti_{0.4}Zr_{0.225}O_3$ | 0.2 | | 1,260 | 695 | 0.58 | 1,657 | 0.39 |
| 6 | $Pb(Mg_{1/3}Ta_{2/3})_{0.375}Ti_{0.4}Zr_{0.225}O_3$ | 0.2 | 1.0 | 1,240 | 1,197 | 0.67 | 1,743 | 0.24 |
| 7 | $Pb(Mg_{1/3}Ta_{2/3})_{0.375}Ti_{0.4}Zr_{0.225}O_3$ | 0.5 | | 1,260 | 1,750 | 0.59 | 1,352 | 0.48 |
| 8 | $Pb(Mg_{1/3}Ta_{2/3})_{0.375}Ti_{0.4}Zr_{0.225}O_3$ | 0.5 | 1.0 | 1,240 | 1,943 | 0.65 | 1,319 | 0.45 |
| 9 | $Pb(Mg_{1/3}Ta_{2/3})_{0.375}Ti_{0.4}Zr_{0.225}O_3$ | 1.0 | | 1,260 | 1,558 | 0.55 | 1,117 | 0.93 |
| 10 | $Pb(Mg_{1/3}Ta_{2/3})_{0.375}Ti_{0.4}Zr_{0.225}O_3$ | 1.0 | 1.0 | 1,240 | 1,762 | 0.60 | 1,085 | 0.90 |
| 11 | $Pb(Mg_{1/3}Ta_{2/3})_{0.375}Ti_{0.4}Zr_{0.225}O_3$ | 3.0 | | 1,240 | 897 | 0.44 | 898 | 3.45 |
| 12 | $Pb(Mg_{1/3}Ta_{2/3})_{0.375}Ti_{0.4}Zr_{0.225}O_3$ | 3.0 | 1.0 | 1,240 | 1,145 | 0.48 | 852 | 3.41 |
| 13 | $Pb(Mg_{1/3}Ta_{2/3})_{0.375}Ti_{0.4}Zr_{0.225}O_3$ | 5.0 | | 1,220 | 469 | 0.40 | 917 | 7.22 |
| 14 | $Pb(Mg_{1/3}Ta_{2/3})_{0.375}Ti_{0.4}Zr_{0.225}O_3$ | 5.0 | 1.0 | 1,240 | 610 | 0.42 | 845 | 9.23 |
| 15 | $Pb(Mg_{1/3}Ta_{2/3})_{0.375}Ti_{0.4}Zr_{0.225}O_3$ | 7.0 | | 1,200 | 260 | 0.38 | 910 | 11.98 |
| 16 | $Pb(Mg_{1/3}Ta_{2/3})_{0.375}Ti_{0.4}Zr_{0.225}O_3$ | 7.0 | 1.0 | 1,220 | 293 | 0.39 | 1,085 | 15.83 |
| 17 | $Pb(Mg_{1/3}Ta_{2/3})_{0.375}Ti_{0.4}Zr_{0.225}O_3$ | | 0.1 | 1,260 | 80 | 0.58 | 1,926 | 1.92 |
| 18 | $Pb(Mg_{1/3}Ta_{2/3})_{0.375}Ti_{0.4}Zr_{0.225}O_3$ | 0.5 | 0.1 | 1,260 | 1,798 | 0.61 | 1,292 | 0.51 |
| 19 | $Pb(Mg_{1/3}Ta_{2/3})_{0.375}Ti_{0.4}Zr_{0.225}O_3$ | | 0.2 | 1,260 | 78 | 0.60 | 1,965 | 1.96 |
| 20 | $Pb(Mg_{1/3}Ta_{2/3})_{0.375}Ti_{0.4}Zr_{0.225}O_3$ | 0.5 | 0.2 | 1,260 | 1,886 | 0.62 | 1,269 | 0.49 |
| 21 | $Pb(Mg_{1/3}Ta_{2/3})_{0.375}Ti_{0.4}Zr_{0.225}O_3$ | | 0.5 | 1,260 | 79 | 0.67 | 2,057 | 1.22 |
| 22 | $Pb(Mg_{1/3}Ta_{2/3})_{0.375}Ti_{0.4}Zr_{0.225}O_3$ | 0.5 | 0.5 | 1,260 | 2,102 | 0.65 | 1,145 | 0.39 |
| 23 | $Pb(Mg_{1/3}Ta_{2/3})_{0.375}Ti_{0.4}Zr_{0.225}O_3$ | 0.5 | 1.0 | 1,240 | 1,974 | 0.65 | 1,308 | 0.43 |
| 24 | $Pb(Mg_{1/3}Ta_{2/3})_{0.375}Ti_{0.4}Zr_{0.225}O_3$ | | 3.0 | 1,240 | 81 | 0.63 | 2,652 | 1.35 |
| 25 | $Pb(Mg_{1/3}Ta_{2/3})_{0.375}Ti_{0.4}Zr_{0.225}O_3$ | 0.5 | 3.0 | 1,240 | 1,865 | 0.62 | 1,631 | 0.48 |
| 26 | $Pb(Mg_{1/3}Ta_{2/3})_{0.375}Ti_{0.4}Zr_{03225}O_3$ | | 5.0 | 1,240 | 83 | 0.60 | 2,864 | 1.26 |
| 27 | $Pb(Mg_{1/3}Ta_{2/3})_{0.375}Ti_{0.4}Zr_{0.225}O_3$ | 0.5 | 5.0 | 1,240 | 1,839 | 0.58 | 1,902 | 0.49 |
| 28 | $Pb(Mg_{1/3}Ta_{2/3})_{0.375}Ti_{0.4}Zr_{0.225}O_3$ | | 7.0 | 1,240 | 85 | 0.57 | 2,790 | 1.36 |
| 29 | $Pb(Mg_{1/3}Ta_{2/3})_{0.375}Ti_{0.4}Zr_{0.225}O_3$ | 0.5 | 7.0 | 1,240 | 1,597 | 0.54 | 1,958 | 0.49 |
| 30 | $Pb(Mg_{1/3}Ta_{2/3})_{0.5}Ti_{0.44}Zr_{0.06}O_3$ | None | None | 1,270 | 125 | 0.40 | 2,503 | 1.52 |
| 31 | $Pb(Mg_{1/3}Ta_{2/3})_{0.5}Ti_{0.44}Zr_{0.06}O_3$ | | 0.5 | 1,260 | 110 | 0.45 | 2,627 | 1.33 |
| 32 | $Pb(Mg_{1/3}Ta_{2/3})_{0.5}Ti_{0.44}Zr_{0.06}O_3$ | 0.5 | 0.5 | 1,260 | 1,504 | 0.47 | 2,519 | 0.38 |
| 33 | $Pb(Mg_{1/3}Ta_{2/3})_{0.5}Ti_{0.44}Zr_{0.06}O_3$ | 1.0 | 0.5 | 1,260 | 1,643 | 0.44 | 2,304 | 0.76 |
| 34 | $Pb(Mg_{1/3}Ta_{2/3})_{0.5}Ti_{0.44}Zr_{0.06}O_3$ | | 1.0 | 1,260 | 120 | 0.49 | 2,643 | 1.10 |
| 35 | $Pb(Mg_{1/3}Ta_{2/3})_{0.5}Ti_{0.44}Zr_{0.06}O_3$ | 0.5 | 1.0 | 1,260 | 1,752 | 0.47 | 2,395 | 0.29 |
| 36 | $Pb(Mg_{1/3}Ta_{2/3})_{0.125}Ti_{0.625}Zr_{0.25}O_3$ | None | None | 1,270 | 210 | 0.29 | 507 | 1.26 |
| 37 | $Pb(Mg_{1/3}Ta_{2/3})_{0.125}Ti_{0.625}Zr_{0.25}O_3$ | 0.5 | | 1,260 | 1,164 | 0.31 | 446 | 0.45 |
| 38 | $Pb(Mg_{1/3}Ta_{2/3})_{0.125}Ti_{0.625}Zr_{0.25}O_3$ | 0.5 | 0.5 | 1,260 | 1,338 | 0.33 | 478 | 0.56 |
| 39 | $Pb(Mg_{1/3}Ta_{2/3})_{0.125}Ti_{0.625}Zr_{0.25}O_3$ | 1.0 | | 1,260 | 1,235 | 0.30 | 394 | 0.85 |
| 40 | $Pb(Mg_{1/3}Ta_{2/3})_{0.125}Ti_{0.625}Zr_{0.25}O_3$ | 1.0 | 0.5 | 1,260 | 1,527 | 0.32 | 441 | 0.79 |

and planar coupling coefficient as compared with that of the composition with a single addition of $MnO_2$.

Figure 4:
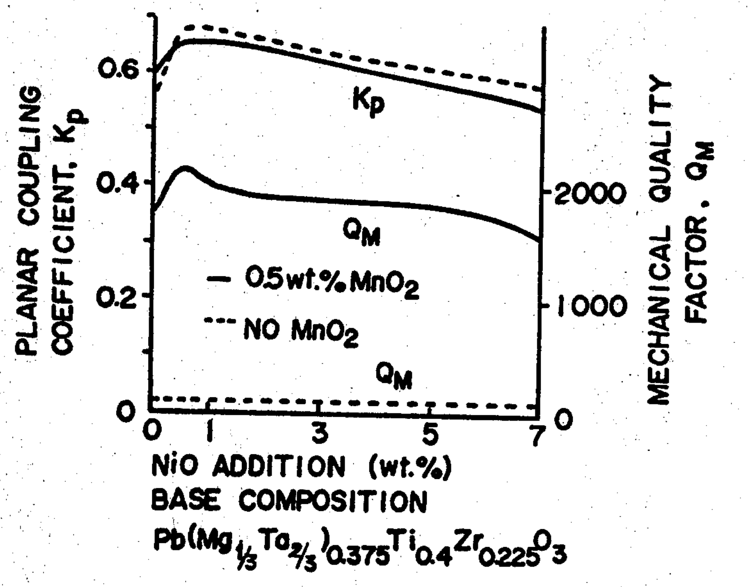

FIG. 4 indicates the effect of amounts of NiO addition on the mechanical quality factor ($Q_M$) and the planar coupling coefficient ($K_p$) of exemplary base compositions having 0.5 weight percent of $MnO_2$ addition. From this figure it will be obvious that the composition modified with combined $MnO_2$ and NiO additives exhibit a remarkable improvement of mechanical quality factor as compared with that of the composition with a single addition of NiO. Planar coupling coefficient of compositions modified with combined $MnO_2$ and NiO additive show a somewhat lowered value, but this value is still higher that that of the basic composition without additive. Improvements of mechanical quality factor for other base compositions are also seen for the Example Nos. 32, 33, 35, 38 and 40 in the table. From the said table and figures, the values of the mechanical quality factor, planar coupling coefficient and dielectric constant can be adjusted to suit various ap-

What is claimed is:

1. A piezoelectric ceramic composition consisting essentially of, a solid solution of a base material expressed by the general formula $Pb(Mg_{1/3}Ta_{2/3})_xTi_yZr_zO_3$, where $x+y+z=1$, and having a composition within a polygonal area ABCDEFGH of FIG. 2 and 0.2 to 6 weight percents of an additive combination of nickel oxide and manganese dioxide, said ceramic composition having 0.2 to 10 weight ratio of nickel oxide to manganese dioxide, the molar ratio of the three components of each vertices are as follows:

| | x | y | z |
|---|---|---|---|
| A | 0.250 | 0.750 | 0.000 |
| B | 0.655 | 0.345 | 0.000 |
| C | 0.500 | 0.250 | 0.250 |
| D | 0.250 | 0.125 | 0.625 |
| E | 0.125 | 0.125 | 0.750 |
| F | 0.010 | 0.240 | 0.750 |
| G | 0.010 | 0.615 | 0.375 |
| H | 0.125 | 0.750 | 0.125 |

2. An electromechanical transducer having an active element formed from an electrostatically polarized ceramic material consisting of a composition as defined in claim 1.

3. A piezoelectric ceramic composition consisting essentially of a solid solution of a base material expressed by the general formula $Pb(Mg_{1/3}Ta_{2/3})_xTi_yZr_zO_3$ where $$x+y+_3=1$$

and having a composition within the polygonal area IJKLMN of FIG. 2 and 0.2 to 6 weight percents of an additive combination of nickel oxide and manganese dioxide, said ceramic composition having 0.2 to 10 weight ratio of nickel oxide to manganese dioxide, the molar ratio of the three components of each vertices are as follows:

| | x | y | z |
|---|---|---|---|
| I | 0.500 | 0.500 | 0.000 |
| J | 0.625 | 0.375 | 0.000 |
| K | 0.250 | 0.345 | 0.405 |
| L | 0.125 | 0.375 | 0.500 |
| M | 0.010 | 0.420 | 0.570 |
| N | 0.010 | 0.510 | 0.480 |

4. An electromechanical transducer having an active element formed from an electrostatically polarized ceramic material consisting of a composition as defined in claim 3.

5. A piezoelectric transducer element comprising an electrostatically polarized solid solution ceramic consisting essentially of a material selected from the polygonal area IJKLMN of FIG. 2 and 1.5 weight percents of an additive combination of nickel oxide and manganese dioxide, said ceramic composition having 0.5 to 2 of a weight ratio of nickel oxide to manganese dioxide.

6. A piezoelectric ceramic composition consisting essentially of $Pb(Mg_{1/3}Ta_{2/3})_{0.375}Ti_{0.4}Zr_{0.225}O_3$ and containing 0.5 weight percent nickel oxide (NiO) and 0.5 weight percent manganese oxide ($MnO_2$).

7. A piezoelectric ceramic composition consisting essentially of $Pb(Mg_{1/3}Ta_{2/3})_{0.5}Ti_{0.44}Zr_{0.06}O_3$ and containing 0.5 weight percent nickel oxide (NiO) and 0.5 weight percent manganese oxide ($MnO_2$).

8. A piezoelectric ceramic composition consisting essentially of $Pb(Mg_{1/3}Ta_{2/3})_{0.125}Ti_{0.625}Zr_{0.25}O_3$ and containing 0.5 weight percent nickel oxide (NiO) and 0.5 weight percent manganese oxide ($MnO_2$).

References Cited

UNITED STATES PATENTS 3,425,944 2/1969 Ouchi et al. -------- 252—62.9

TOBIAS E. LEVOW, Primary Examiner

JACK COOPER, Assistant Examiner

U.S. Cl. X.R.

106—39